(12) United States Patent
Bayless et al.

(10) Patent No.: US 10,559,495 B2
(45) Date of Patent: *Feb. 11, 2020

(54) METHODS FOR PROCESSING SEMICONDUCTOR DICE AND FABRICATING ASSEMBLIES INCORPORATING SAME

(71) Applicant: Micron Technology, Inc., Boise, ID (US)

(72) Inventors: Andrew M. Bayless, Boise, ID (US); James M. Derderian, Boise, ID (US); Xiao Li, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/199,788

(22) Filed: Nov. 26, 2018

(65) Prior Publication Data

US 2019/0198388 A1 Jun. 27, 2019

Related U.S. Application Data

(63) Continuation of application No. 15/851,304, filed on Dec. 21, 2017, now Pat. No. 10,163,693.

(51) Int. Cl.
*H01L 21/304* (2006.01)
*H01L 21/306* (2006.01)
(Continued)

(52) U.S. Cl.
CPC .. *H01L 21/76834* (2013.01); *H01L 21/02041* (2013.01); *H01L 21/561* (2013.01);
(Continued)

(58) Field of Classification Search
None
See application file for complete search history.

(56) References Cited

U.S. PATENT DOCUMENTS

2004/0140533 A1 7/2004 Stern
2013/0302979 A1 11/2013 Yu et al.
(Continued)

FOREIGN PATENT DOCUMENTS

CN 106098630 A 11/2016

OTHER PUBLICATIONS

Charlie Lu; "Overview of Fan-out Wafer Level Package (FO-WLP) and Fan-out Panel Level Package (FO-PLP)"; Oct. 24, 2014. (Year: 2014).

(Continued)

*Primary Examiner* — Shamim Ahmed
(74) *Attorney, Agent, or Firm* — TraskBritt

(57) ABSTRACT

A method for processing semiconductor dice comprises removing material from a surface of a semiconductor wafer to create a pocket surrounded by a sidewall at a lateral periphery of the semiconductor wafer, forming a film on a bottom of the pocket and securing semiconductor dice to the film in mutually spaced locations. A dielectric molding material is placed in the pocket over and between the semiconductor dice, material is removed from another surface of the semiconductor wafer to expose the film, bond pads of the semiconductor dice are exposed, redistribution layers in electrical communication with the bond pads of associated semiconductor dice are formed, and the redistribution layers and associated semiconductor dice are singulated along spaces between the semiconductor dice.

14 Claims, 2 Drawing Sheets

(51) Int. Cl.

| | |
|---|---|
| *H01L 23/28* | (2006.01) |
| *H01L 21/768* | (2006.01) |
| *H01L 21/02* | (2006.01) |
| *H01L 23/29* | (2006.01) |
| *H01L 21/56* | (2006.01) |
| *H01L 23/31* | (2006.01) |

(52) U.S. Cl.
CPC .......... *H01L 21/568* (2013.01); *H01L 23/298* (2013.01); *H01L 23/3128* (2013.01)

(56) References Cited

U.S. PATENT DOCUMENTS

| | | |
|---|---|---|
| 2015/0001708 A1 | 1/2015 | Lin |
| 2018/0102322 A1 | 4/2018 | Kang et al. |
| 2018/0166356 A1 | 6/2018 | Butt et al. |
| 2018/0182682 A1 | 6/2018 | Fan |

OTHER PUBLICATIONS

Campos et al; "System in Package Solutions using Fan-Out Wafer Level Packaging Technology"; Jun. 27, 2013. (Year: 2013).
Chinese Office Action and Search Report from Chinese Application No. 201811471279.6, dated Oct. 9, 2019, 16 pages.

METHODS FOR PROCESSING SEMICONDUCTOR DICE AND FABRICATING ASSEMBLIES INCORPORATING SAME

CROSS-REFERENCE TO RELATED APPLICATION

This application is a continuation of U.S. patent application Ser. No. 15/851,304, filed Dec. 21, 2017, pending, the disclosure of which is hereby incorporated herein in its entirety by this reference.

TECHNICAL FIELD

Embodiments disclosed herein relate to processing of singulated semiconductor dice. More particularly, embodiments disclosed herein relate to processing of singulated semiconductor dice on a wafer scale and to methods of fabricating a reconstituted wafer and fan out package semiconductor devices.

BACKGROUND

Semiconductor dice in a so-called fan out package (FOP) configuration are becoming a popular packaging option, particularly for use in mobile devices such as smart phones and tablets, as well as automotive applications, as the assemblies enable ultra-thin, high-density packages. The technique eliminates the use of a conventional interposer and is particularly suitable when a semiconductor die used in a chip scale package undergoes one or more shrinks, resulting in lack of space for the associated ball grid array (BGA). In FOP technology, a redistribution layer (RDL) comprising at least one level of conductive traces, is employed to provide external connection points, such as a BGA from the fine pitch of bond pads on a semiconductor die to a larger footprint with much larger pitch between the external connection points.

Conventionally, FOP fabrication is implemented from either a die-first or a die-last wafer level approach. In a die-first approach, an array of redistribution layers is fabricated on an array of previously singulated semiconductor dice encapsulated on a carrier substrate, and the encapsulated dice and each associated redistribution layer (RDL) are singulated from the array. In a die-last approach, an array of RDLs is fabricated on a carrier substrate, semiconductor dice are connected to the RDLs, the dice are encapsulated, and each semiconductor die and associated RDL are then singulated from the array. In some instances, multiple semiconductor dice are connected to the same RDL, but the fabrication process is the same.

For a conventional die-first process, die shift is a challenge, as are non-uniform edges and handing after RDL fabrication. The as-formed array of semiconductor dice and RDLs is undersized compared to conventional wafers, presenting handling problems and requiring modifications of the tools used for wafer handling. Conventional die-first fabrication techniques involve placing an array of semiconductor dice active-surface down on a carrier substrate having an adhesive thereon. The semiconductor dice are encapsulated by a dielectric molding material, after which the carrier substrate and adhesive are removed from the molded semiconductor dice array characterized as a reconstituted wafer, and residual adhesive is removed. The reconstituted wafer is then inverted and an RDL is formed over the active surfaces of the semiconductor dice, solder balls or other external connections are attached or formed, and the reconstituted wafer is then singulated.

The above-described die-first approach requires expensive adhesives and solvents to remove the adhesive, warping of the reconstituted wafer may occur due to shrinkage of the molding material during cure, and the reconstituted wafer presents handling problems due to being undersized compared to standard wafers for which handling equipment is designed.

DETAILED DESCRIPTION

Figure 1B:
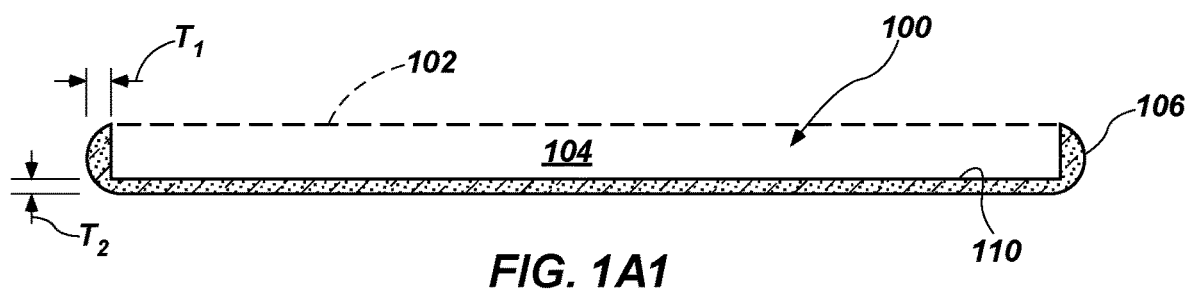
FIGS. 1A1 through 1F depict schematically acts in a process for forming RDLs on a wafer scale according to embodiments of the disclosure.
Figure 1B:
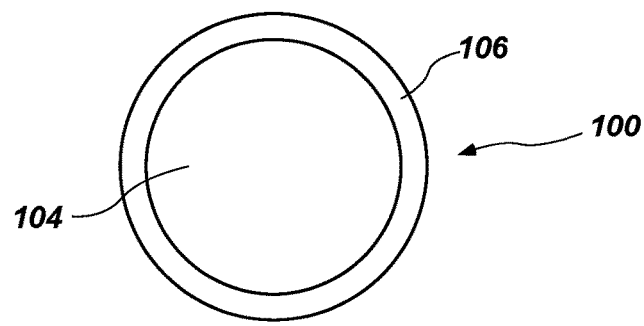
Figure 1B:
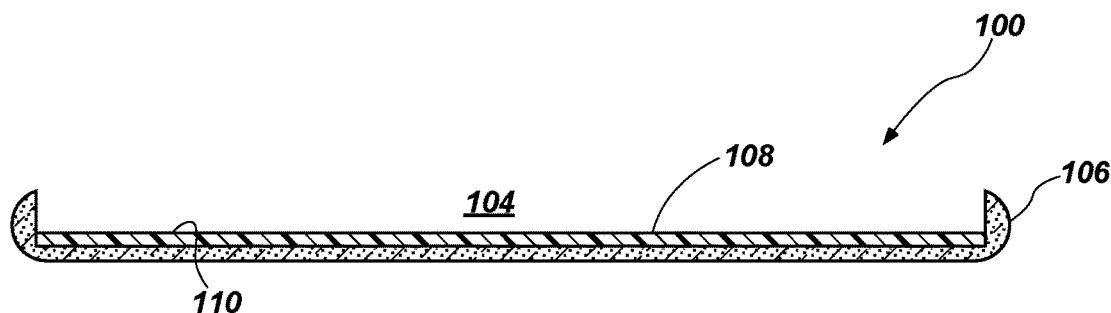

A die-first process for fabricating FOPs is described, according to embodiments of the disclosure.

The following description provides specific details, such as sizes, shapes, material compositions, and orientations in order to provide a thorough description of embodiments of the disclosure. However, a person of ordinary skill in the art would understand that the embodiments of the disclosure may be practiced without necessarily employing these specific details. Embodiments of the disclosure may be practiced in conjunction with conventional fabrication techniques employed in the industry. In addition, the description provided below does not form a complete process flow for manufacturing an FOP structure. Only those process acts and structures necessary to understand the embodiments of the disclosure are described in detail below. Additional acts to form a complete FOP structure from the structures described herein may be performed by conventional fabrication processes.

Drawings presented herein are for illustrative purposes only, and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles between surfaces that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale.

As used herein, the terms "comprising," "including," "containing," "characterized by," and grammatical equivalents thereof are inclusive or open-ended terms that do not exclude additional, unrecited elements or method acts, but also include the more restrictive terms "consisting of" and "consisting essentially of" and grammatical equivalents thereof. As used herein, the term "may" with respect to a material, structure, feature or method act indicates that such is contemplated for use in implementation of an embodiment of the disclosure and such term is used in preference to the more restrictive term "is" so as to avoid any implication that other, compatible materials, structures, features and methods usable in combination therewith should or must be, excluded.

As used herein, the terms "longitudinal," "vertical," "lateral," and "horizontal" are in reference to a major plane of a substrate (e.g., base material, base structure, base construction, etc.) in or on which one or more structures and/or features are formed and are not necessarily defined by earth's gravitational field. A "lateral" or "horizontal" direction is a direction that is substantially parallel to the major plane of the substrate, while a "longitudinal" or "vertical" direction is a direction that is substantially perpendicular to the major plane of the substrate. The major plane of the substrate is defined by a surface of the substrate having a relatively large area compared to other surfaces of the substrate.

As used herein, spatially relative terms, such as "beneath," "below," "lower," "bottom," "above," "over," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "over" or "above" or "on" or "on top of" other elements or features would then be oriented "below" or "beneath" or "under" or "on bottom of" the other elements or features. Thus, the term "over" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the singular forms "a," "an," and "the" are intended to include the plural forms as well, unless the context clearly indicates otherwise.

As used herein, the terms "configured" and "configuration" refer to a size, shape, material composition, orientation, and arrangement of one or more of at least one structure and at least one apparatus facilitating operation of one or more of the structure and the apparatus in a predetermined way.

As used herein, the term "substantially" in reference to a given parameter, property, or condition means and includes to a degree that one of ordinary skill in the art would understand that the given parameter, property, or condition is met with a degree of variance, such as within acceptable manufacturing tolerances. By way of example, depending on the particular parameter, property, or condition that is substantially met, the parameter, property, or condition may be at least 90.0% met, at least 95.0% met, at least 99.0% met, or even at least 99.9% met.

As used herein, the term "about" in reference to a given parameter is inclusive of the stated value and has the meaning dictated by the context (e.g., it includes the degree of error associated with measurement of the given parameter).

As used herein the terms "layer" and "film" mean and include a level, sheet or coating of material residing on a structure, which level or coating may be continuous or discontinuous between portions of the material, and which may be conformal or non-conformal, unless otherwise indicated.

Figure 1C:
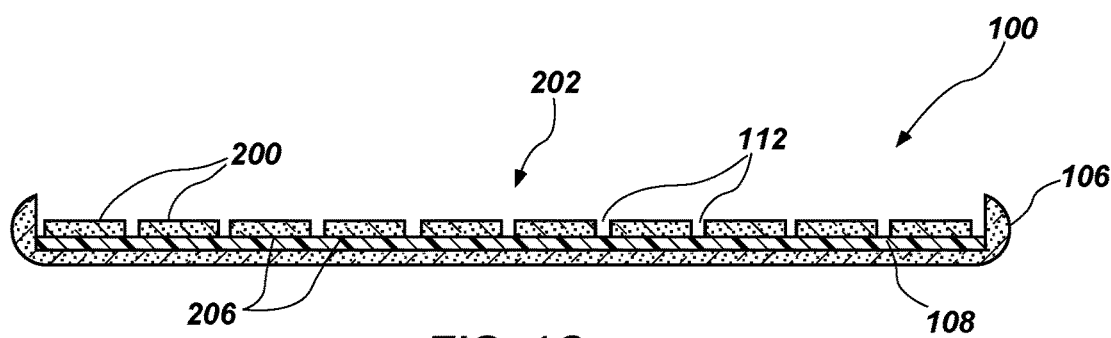
Figure 1D:
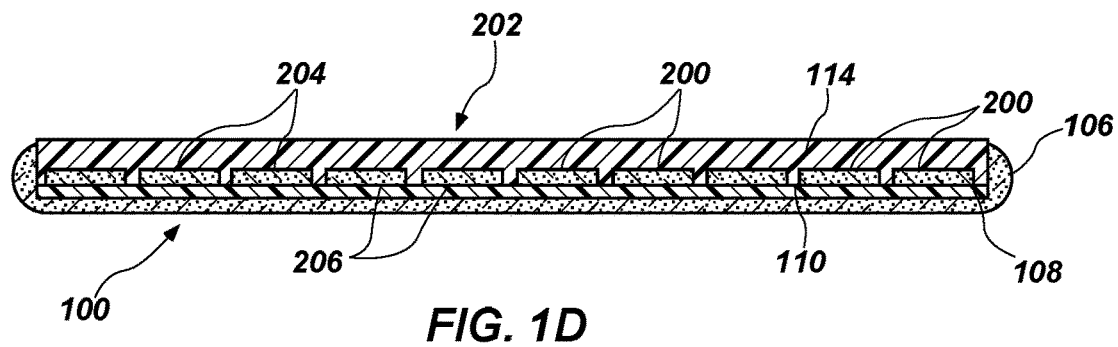
Figure 1E:
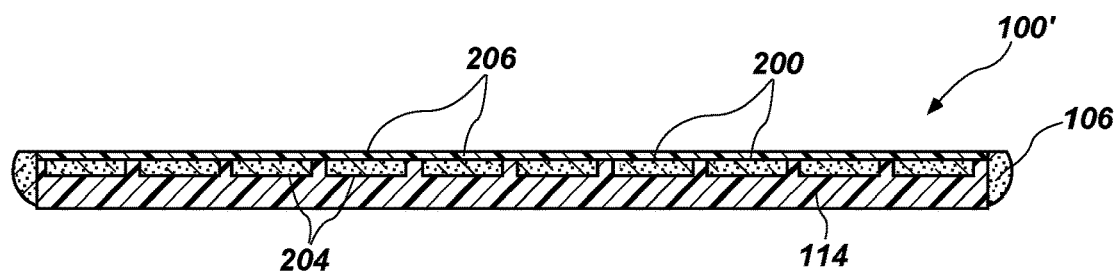
Figure 1F:
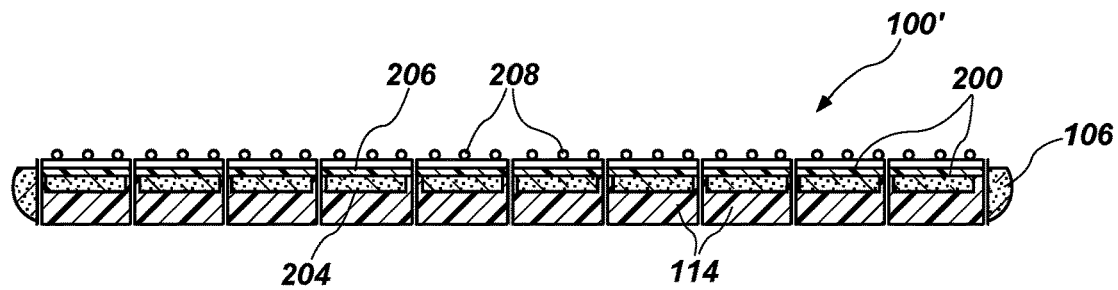
Figure 2:
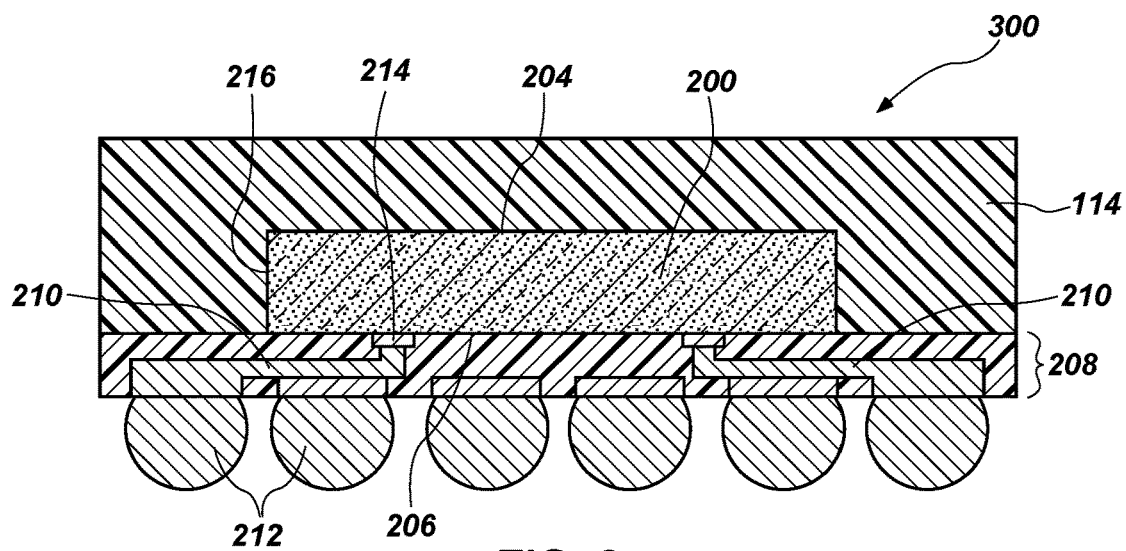
FIG. 2 is a schematic side sectional elevation of an FOP fabricated according to embodiments of the disclosure.

FIGS. 1A1 and 1A2 depict a wafer 100, for example a silicon wafer. The wafer 100 employed, for example, may be a lower grade pristine silicon wafer received from a vendor or a previously processed, reclaimed wafer. Of course, wafers of other materials may also be employed. It is contemplated that the wafer 100 be of conventional configuration and size, for example 300 mm, for compatibility with existing wafer-handling equipment. As shown in broken line 102, an initial thickness of the wafer may be, for example, at least about 600 μm and as much as about 775 μm. A pocket 104, which may also be characterized as a recess, is formed in wafer 100 by removing wafer material from a major surface thereof using a grinding process, for example a Taiko back grinding process performed by a DAG810 automatic grinder, offered by DISCO Corporation of Tokyo, Japan. At the conclusion of the grinding process, a sidewall 106 of the initial thickness of wafer 100 remains intact at the lateral periphery of wafer 100, surrounding pocket 104. After pocket 104 is formed, at the lateral periphery of wafer 100, the sidewall 106 of wafer 100 defining an outer boundary of pocket 104 may have a lateral thickness $T_1$ of about 2 mm to about 5 mm. Also after pocket 104 is formed, a remaining vertical thickness $T_2$ of the wafer in the pocket region between the bottom 110 of pocket 104 and the back surface of wafer 100 may be, for example, between about 20 μm and about 50 μm.

FIG. 1B depicts wafer 100 with a film 108 formed or deposited on the bottom 110 of pocket 104. Film 108 is employed for die attach, as subsequently described herein and may comprise a dielectric material or a conductive material. If formed of a dielectric material, film 108 may comprise a polyimide, benzocyclobutene (BCB), a phenyl-based material or an epoxy-based material applied, for example by a spin-on technique, screen printing or film lamination. Film 108 may remain or be removed during subsequent processing. Such a film may have a thickness, for example, of about 1 μm to about 5 μm. If formed of a conductive material, film 108 may comprise a seed layer of a solder-wettable material such as copper, nickel, or gold, deposited by physical vapor deposition (PVD), also commonly called "sputtering." A sacrificial layer of tin may also be employed. Such a metal film may have a thickness, for example, of about 0.1 μm to about 5 μm.

FIG. 1C depicts placement and bonding of previously singulated semiconductor dice 200 within pocket 104. Semiconductor dice 200 may be placed on film 108 on the bottom 110 of pocket 104 of wafer 100 with active surfaces 206 facing the film 108 in an array 202 using conventional pick-and-place equipment. The array 202 of semiconductor die 200 may comprise rows and columns of dice, with spaces in the form of streets 112 between and mutually separating adjacent semiconductor dice 200. After placement, semiconductor dice 200 are secured to film 108 at the bottom 110 of pocket 104. If a dielectric material is used for film 108, use of a partially cured material enables die attach. The film 108 is then cured prior to encapsulation of semiconductor dice as described below with reference to FIG. 1D. Notably if a preformed film is employed, the semiconductor dice 200 may be first placed on, and adhered to the film 108, and the film 108 then applied to the bottom 110 of pocket 104. If a conductive, metal material is employed, metal-to-metal bonding of semiconductor dice 200 to film 108 may be effected by heat-induced diffusion bonding or, for example, if tin is employed as a sacrificial layer, by reflow of the metal.

FIG. 1D depicts placement of a dielectric molding material 114 over semiconductor dice 200 in pocket 104, molding material 114 substantially filling the pocket 104 and covering the backs 204 of semiconductor dice 200 and filling the streets 112. A suitable molding material 114 may be, for example, applied by screen printing or film lamination, and cured. One suitable screen printable material is Hitachi Chemical CEL-C-7732. Suitable sheet type materials suitable for film lamination include, for example, Nagase T751-51/SO2 and Kyocera KE-G1250 SS.

As depicted in FIG. 1E, wafer 100 with encapsulated array 202 of semiconductor dice 200 may be inverted, and remaining vertical thickness $T_2$ (see FIG. 1A1) of material of wafer 100 may be removed by wet (i.e., chemical) or dry (i.e., reactive ion) etching selective to silicon over the material of film 108, or by grinding followed by chemical mechanical planarization (CMP), to expose the film 108 (not shown in FIG. 1E) over active surfaces 206 of semiconductor dice 200. Notably, wafer material forming the sidewall 106 of the pocket 104 remains intact, resulting in a full-size reconstituted wafer 100' easily handled by conventional equipment without modification. If film 108 is a dielectric material, bond pads of semiconductor dice 200 may be exposed by selective masking and etching of film 108. If a polyimide is used as a material for film 108, a mask and wet alkaline etch comprising KOH may be employed. If film 108 is a metal material, a selective masking and seed etch may be performed to electrically isolate the bond pads of semiconductor dice 200. If copper is used as a material for film 108, a wet etch using a mixture of sulfuric acid and hydrogen peroxide in deionized water may be employed.

As depicted in FIG. 1F, conventional RDL fabrication processing may then be performed at a wafer level on active surfaces 206 of each semiconductor die to substantially simultaneously form traces, interconnects and optionally under bump metallization and conductive (i.e., solder) bumps of an RDL 208 thereon. RDL formation may be effected using an additive process, wherein conductive traces are formed in trenches of a dielectric material, or using a subtractive process, wherein blanket metallization is employed, followed by masking and etching to form conductive traces. In both instances, dielectric material is disposed above and below trace levels, and interconnects to bond pads and other connections formed in apertures in the dielectric by conventional techniques. A single level of conductive traces may be formed, or multiple levels as desired, using either an additive or a subtractive process. The wafer 100' may then be thinned, for example by back grinding, to remove some or all of molding material 114 from the backs 204 of semiconductor dice 200 and material from the surrounding sidewall 106, after which the semiconductor dice 200 and associated RDL 208 for each die are singulated through streets 112 by a conventional wafer saw to form packages, for example FOPs, wherein at least sides of semiconductor dice 200 are encapsulated by molding material. If some molding material 114 remains on the backs 204 of semiconductor dice 200, the RDLs 208, dice 200 and molding material together may exhibit a thickness of, for example, about 200 µm.

FIG. 2 depicts an example of an FOP 300 singulated from reconstituted wafer 100' after fabrication of RDL 208 thereon. As shown, RDL 208 includes conductive traces 210 leading to conductive (e.g., solder) bumps 212 from bond pads 214 on active surface 206 of semiconductor die 200, which is encapsulated on the sides 216 and back 204 thereof by dielectric molding material 114.

As is apparent from the above description, embodiments of the disclosure provide a robust structure for die-first FOP fabrication, and one that may be handled by conventional wafer-handling equipment. The sidewall of wafer 100 and 100', which may also be characterized as a "ring," offers support for the in-process assembly and offers the exact wafer size that conventional equipment is designed to handle. Die shift after placement of semiconductor dice 200 in pocket 104 on film 108 may be reduced as compared to conventional techniques using an adhesive to secure the semiconductor dice, and wafer warping attributable to the cure and shrinkage of molding material 114 may be reduced. The thickness of wafer 100 and 100' with semiconductor dice 200 and molding material 114 provides a rigid structure that minimizes warping tendencies. Embodiments of the disclosure provide a higher thermal budget, better chemical resistance and lower cost by eliminating the use of temperature-sensitive adhesives used to secure dice to a carrier substrate in conventional wafer level RDL processing, as well as solvents used to remove the adhesive. Higher process temperatures in terms of the ability to fabricate RDLs using high quality dielectrics requiring higher temperature cures and high temperature plasma-enhanced chemical vapor deposition (PECVD) of conductive trace materials in the RDLs are enabled.

Embodiments of the disclosure include a method for processing semiconductor dice comprising removing material from a surface of a semiconductor wafer to create a pocket surrounded by a sidewall, forming a film on a bottom of the pocket, and securing the semiconductor dice to the film in mutually spaced locations. A dielectric molding material is placed in the pocket over and between the semiconductor dice, material is removed from another surface of the semiconductor wafer to expose the film, bond pads of the semiconductor dice are exposed, redistribution layers in electrical communication with the bond pads of associated semiconductor dice are formed, and the redistribution layers and associated semiconductor dice are singulated along spaces between the semiconductor dice.

Other embodiments of the disclosure include a method for processing semiconductor dice comprising creating a pocket in a silicon wafer by grinding silicon from one major surface of the silicon wafer toward an opposing major surface and leaving a sidewall of silicon surrounding the pocket, depositing a film comprising one of a dielectric material and a metal material on a bottom of the pocket and bonding semiconductor dice to the film by active surfaces in an array comprising rows and columns of semiconductor dice mutually separated by streets. Sides and backs of the semiconductor dice are encapsulated with a dielectric molding material, the film is exposed by etching silicon from another major surface of the semiconductor wafer, and the film is patterned to expose bond pads of the semiconductor dice. A redistribution layer is substantially simultaneously formed on each semiconductor die in electrical communication with the bond pads of an associated semiconductor die, and each redistribution layer and at least one associated semiconductor die is singulated along streets between the semiconductor dice.

Further embodiments of the disclosure include a method for forming a reconstituted wafer, comprising forming a recess surrounded by a sidewall in a semiconductor wafer, forming a film on a bottom surface of the recess, securing the semiconductor dice to the film in an array of mutually spaced locations, covering backs and sides of the semiconductor dice with a dielectric molding material substantially filling the recess, and removing material from another surface of the semiconductor wafer to expose the film.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. A method for processing semiconductor dice, the method comprising:
   securing the semiconductor dice having bond pads thereon in mutually spaced locations to a film of metal material on a bottom of a pocket in a semiconductor wafer;
   placing a dielectric molding material over and between the semiconductor dice;
   removing material from a surface of the semiconductor wafer opposite the pocket to expose the film; and
   exposing the bond pads of the semiconductor dice through the film.

2. The method of claim 1, further comprising forming redistribution layers over the semiconductor dice and singulating the redistribution layers and associated semiconductor dice between the semiconductor dice.

3. The method of claim 1, further comprising exposing backs of the semiconductor dice before singulating the redistribution layers and associated semiconductor dice.

4. The method of claim 1, wherein forming the film of metal material comprises forming the film of at least one of copper, nickel, gold or tin.

5. The method of claim 1, wherein securing the semiconductor dice to the film comprises securing the semiconductor dice to the metal material by diffusion bonding, or by reflow of the metal material.

6. The method of claim 1, wherein removing material from a surface of the semiconductor wafer opposite the pocket comprises etching the material.

7. A method for processing semiconductor dice, the method comprising:
   depositing a film comprising a metal material on a surface of a semiconductor wafer;
   bonding an array of mutually separated semiconductor dice to the film by active surfaces having bond pads thereon;
   encapsulating sides and back sides of the semiconductor dice with a dielectric molding material;
   exposing the film by etching silicon from an opposing surface of the semiconductor wafer;
   patterning the film to expose the bond pads of the semiconductor dice;
   forming an array of redistribution layers over the semiconductor dice in electrical communication with the bond pads of associated semiconductor dice; and
   singulating redistribution layers and associated semiconductor dice from the arrays.

8. The method of claim 7, wherein depositing a film comprises depositing a metal film of at least one of copper, nickel, gold or tin.

9. The method of claim 8, wherein bonding an array of mutually separated semiconductor dice to the film comprises one of diffusion bonding and reflow bonding.

10. The method of claim 7, further comprising removing the dielectric molding material from the back sides of the semiconductor dice prior to singulating each redistribution layer and at least one associated semiconductor die of the arrays.

11. A method for fabricating a reconstituted wafer, the method comprising:
    forming a film comprising a metal material on a surface of a semiconductor wafer;
    securing semiconductor dice to the film in an array of mutually spaced locations;
    covering backs and sides of the semiconductor dice with a dielectric molding material; and
    removing material from an opposing surface of the semiconductor wafer to expose the film.

12. The method of claim 11, further comprising forming a recess in the semiconductor wafer, wherein forming the film of a surface of a semiconductor wafer comprises forming the film on a bottom surface of the recess.

13. The method of claim 11, wherein removing material from an opposing surface of the semiconductor wafer to expose the film comprises etching of the material.

14. The method of claim 11, further comprising thinning the reconstituted wafer by removing a thickness of dielectric molding material from the backs of the semiconductor dice.

* * * * *